US006737800B1

(12) United States Patent
Winters et al.

(10) Patent No.: US 6,737,800 B1
(45) Date of Patent: May 18, 2004

(54) WHITE-EMITTING ORGANIC ELECTROLUMINESCENT DEVICE WITH COLOR FILTERS AND REFLECTIVE LAYER FOR CAUSING COLORED LIGHT CONSTRUCTIVE INTERFERENCE

(75) Inventors: Dustin Winters, Webster, NY (US); Joel D. Shore, Rochester, NY (US); Steven A. Van Slyke, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/369,416

(22) Filed: Feb. 18, 2003

(51) Int. Cl.[7] ................................................. H01J 1/70
(52) U.S. Cl. ..................... 313/504; 313/505; 313/113
(58) Field of Search ................... 313/504–506, 313/509, 113; 427/66; 257/40, 98; 315/169.3

(56) References Cited

U.S. PATENT DOCUMENTS

| | | | |
|---|---|---|---|
| 5,550,066 A | | 8/1996 | Tang et al. |
| 6,124,024 A | * | 9/2000 | Hosokawa et al. ......... 428/212 |
| 6,366,017 B1 | * | 4/2002 | Antoniadis et al. ........ 313/506 |
| 6,392,340 B2 | | 5/2002 | Yoneda et al. |
| 6,639,250 B1 | * | 10/2003 | Shimoda et al. ............. 257/98 |
| 2003/0057828 A1 | * | 3/2003 | Roitman et al. ............ 313/506 |

FOREIGN PATENT DOCUMENTS

| | | |
|---|---|---|
| EP | 1 102 317 | 5/2001 |
| JP | 4(1992)328295 | 2/1991 |
| JP | 2002252087 A | 9/2002 |

* cited by examiner

Primary Examiner—Nimeshkumar D. Patel
Assistant Examiner—Glenn Zimmerman
(74) Attorney, Agent, or Firm—Raymond L. Owens

(57) ABSTRACT

A multicolor organic light-emitting display having an array of pixels having at least two different colors including a substrate; a reflective layer disposed over the substrate; and a first transparent electrode disposed over the reflective layer. The display also includes a second transparent electrode spaced from the first transparent electrode and an organic EL media disposed between the first and second transparent electrodes and arranged to produce white light. The display further includes at least first and second filters of different colors disposed respectively over different predetermined pixels of the array, and wherein the thickness of the first transparent electrode is separately adjusted for each different color to cause a substantial amount of the reflected component of colored light corresponding to its associated color filter to constructively interfere with a substantial amount of the non-reflected component of colored light corresponding to its associated color filter.

12 Claims, 4 Drawing Sheets

WHITE-EMITTING ORGANIC ELECTROLUMINESCENT DEVICE WITH COLOR FILTERS AND REFLECTIVE LAYER FOR CAUSING COLORED LIGHT CONSTRUCTIVE INTERFERENCE

CROSS REFERENCE TO RELATED APPLICATIONS

Reference is made to commonly assigned U.S. patent application Ser. No. 10/368,513 filed herewith by Yuan-Sheng Tyan et al., entitled "TUNED MICROCAVITY COLOR OLED DISPLAY", the disclosure of which is herein incorporated by reference.

FIELD OF THE INVENTION

The present invention relates to organic electroluminescent (EL) devices. More specifically, this invention relates to a multicolor, top-side white-emitting EL device with a color filter array with improved efficiency.

BACKGROUND OF THE INVENTION

Organic EL displays are typically coupled with active matrix (AM) circuitry in order to produce high performance displays. Such a display is disclosed in U.S. Pat. No. 5,550,066. However, in this type of display where light is emitted downward through the substrate, the overall area that can emit light is limited by the presence of thin film transistors (TFT's) and other circuitry, which are opaque. The area of the display pixels that emit light relative to the total area of the pixels is known as the aperture ratio (AR) and is typically less than 50%. In order to compensate for lower AR, the device must be driven at a higher current density compared to a device with a high AR. This results in the lower AR devices having a shorter useable life than a device with a higher AR.

Therefore, much work has been done to produce AM devices which are top or surface emitting, that is where light is removed through the upper surface away from the substrate and TFT circuitry. Such a device is described in EP 1 102 317. This allows for improved AR and therefore improved performance of the display.

With a top-emitting AM device, AR could theoretically approach 100%, but is still limited by the ability to pattern all the necessary layers. That is, tolerance must be allowed between neighboring pixels for the maximum alignment error and minimum patterning resolution for each layer. This between-pixel region does not emit light and therefore lessens the AR. Many of these layers are typically patterned using photolithography techniques, which have good alignment and resolution. In the above examples of organic EL devices, in order to produce multicolor devices, such as red-green-blue (RGB) displays, the organic EL materials must be patterned as well. However, the organic materials used in organic EL films are typically incompatible with photolithography methods and therefore require other deposition techniques. For small molecule organic EL materials, the most common patterning method is deposition through a precision aligned shadow mask. Shadow mask patterning, however, has relatively poor alignment and resolution compared to photolithography. Shadow mask patterning alignment becomes even more difficult when scaled up to larger substrate sizes. Therefore, using shadow masking, the full benefits of AR gain potentially obtainable using top-emitting AM device techniques cannot be realized.

Furthermore, shadow mask patterning, which typically requires contact of the mask to the substrate, can cause defects such as scratching which reduces yield. Alignment of the shadow mask to the substrate also requires time, which reduces throughput and increases manufacturing equipment complexity.

A white-emitting EL layer can be used to form a multicolor device. Each pixel is coupled with a color filter element as part of a color filter array (CFA) to achieve a pixilated multicolor display. The organic EL layer is common to all pixels and the final color as perceived by the viewer is dictated by that pixel's corresponding color filter element. Therefore, a multicolor or RGB device can be produced without requiring any patterning of the organic EL layers. Therefore, white CFA top-emitting AM displays offer superior AR, yield, and throughput compared to multicolor patterned top-emitting AM displays. An example of a white CFA top-emitting device is shown in U.S. Pat. No. 6,392,340.

In Japanese Patent Application Laid-Open No Heisei 4(1992)-328295, a device with improved efficiency is shown. Here, improved efficiency was achieved by optimizing the electron transport EL layer such that light generated in the direction of the viewer and light generated in the direction away from the viewer and reflected back toward the viewer by the reflective electrode interfere constructively with each other.

However, this method of optimizing the organic EL structure is incompatible with a multicolor white-emitting organic EL device. In multicolor EL devices, each of the groups of pixels that are seen by the viewer as having a different color (hereafter referred to as a pixel color group) must be optimized differently depending on the desired color or wavelength of the pixel color group. Since the white-emitting devices are only advantageous if no patterning of the organic EL media layers is done, having one or more of the organic EL media layers with varying thickness for each pixel color group is not practical. Therefore, for white CFA top-emitting AM organic EL displays, a new structure is required to realize the benefits of optical interference optimization.

SUMMARY OF THE INVENTION

It is therefore an object of the present invention to provide an organic EL structure for use with multicolor top emission active matrix organic EL devices, which can be optimized for constructive optical interference and does not require precision patterning of the organic EL media layers for each pixel.

This object is achieved by a multicolor organic light-emitting display having an array of pixels having at least two different colors comprising:

a) a substrate;

b) a reflective layer disposed over the substrate;

c) a first transparent electrode disposed over the reflective layer;

d) a second transparent electrode spaced from the first transparent electrode;

e) organic EL media disposed between the first and second transparent electrodes and arranged to produce white light;

f) at least first and second filters of different colors disposed respectively over different predetermined pixels of the array; and g) wherein the thickness of the first transparent electrode is separately adjusted for each different color to cause a substantial amount of the reflected component of colored light corresponding to its associated color filter to constructively interfere with a substantial amount of the non-reflected component of colored light corresponding to its associated color filter.

ADVANTAGES

This invention has the advantage over prior white top-emitting organic EL devices of improved color efficiency without the need to pattern any of the organic EL Layers between the pixels. It is a further advantage that any layers that require patterning can be patterned using highly-precise photolithography techniques. The invention has the further advantage of allowing for wider selection of transparent electrode materials.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "pixel" is employed in its art-recognized usage to designate an area of a display panel that can be stimulated to emit light independently of other areas. The term "OLED device" or "organic light-emitting display" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel which can be independently addressable to emit a specific color. For example, a blue subpixel is that portion of a pixel which can be addressed to emit blue light. In a full color display, a pixel generally comprises three primary-color subpixels, namely blue, green, and red. The term "pitch" is used to designate the distance separating two pixels or subpixels in a display panel. Thus, a subpixel pitch means the separation between two subpixels.

For top-emitting AM organic EL displays, an alternative organic EL structure using broadband emitting (commonly referred to as "White" or "white light-emitting") materials coupled with a color filter array (CFA) is sometimes beneficial. The terms "white", "white emission" or "white-emitting" refer to emission of a broad range of wavelengths encompassing the colors desired for the displays but do not necessarily refer to a specific color. For example, a display designed to have yellow and red subpixels can be considered to be white-emitting without blue wavelengths in the emission, so that if the direct emission (that is, without color filters) were visible to a viewer, it would be perceived as being orange in color.

Figure 1:
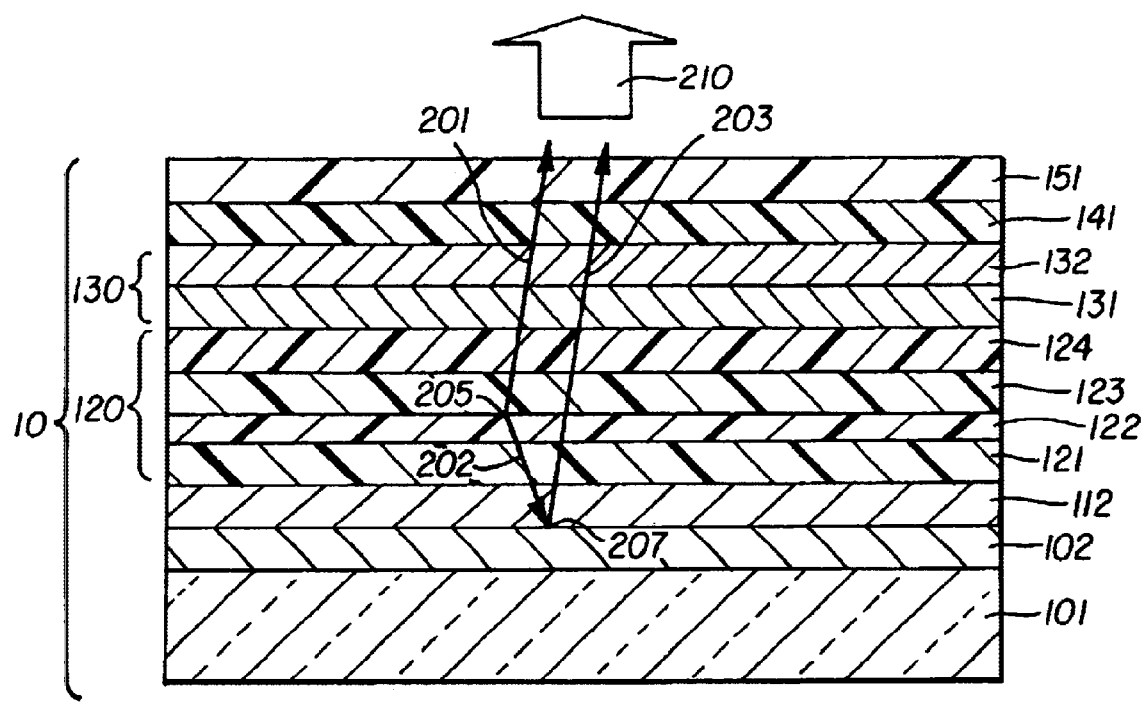
FIG. 1 shows a typical cross section of a pixel which would be used to form a multicolor device according to a first embodiment of the present invention.

Turning now to FIG. 1, there is shown a typical cross section of a pixel 10 which would be used to form a multicolor device according to a first embodiment of the present invention. In some embodiments, pixel 10 can be a subpixel as defined above. The pixel includes a substrate 101, a reflective layer 102 disposed over substrate 101, a first transparent electrode 112 disposed over reflective layer 102, and a second transparent electrode 130 spaced from first transparent electrode 112. Organic EL media 120 is disposed between first transparent electrode 112 and second transparent electrode 130, and is arranged to produce white light in a manner which will become evident. Pixel 10 also includes color filter 151 disposed over the pixel to restrict the portion of white light generated by pixel 10 to a single desired color. Pixel 10 can also include additional layers, for example encapsulation layer 141 which can protect the entire display.

Substrate 101 can be an organic solid, an inorganic solid, or a combination of organic and inorganic solids that provides a surface for forming a display. Substrate 101 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 101 can be a homogeneous mixture of materials, a composite of materials, or multiple layers of materials. Substrate 101 can be an OLED substrate, that is a substrate commonly used for preparing OLED devices, e.g. active-matrix low-temperature polysilicon TFT substrate. For the purposes of this invention, the EL emission is viewed through the top electrode. The transmissive characteristic of the bottom support is immaterial, and therefore can be light transmissive, light absorbing, or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices. Substrate 101 can be coated with other layers.

Reflective layer 102 is disposed over the substrate 101. Reflective layer 102 is preferably a material which is highly reflective at the wavelengths used in the multicolor display. Preferred materials include metals such as Ag, Au, Mo, and Al. However, any reflective material may be used and it is not required that the material be conductive. Methods of depositing reflective layer 102 are well known in the art and include sputtering and evaporations. Reflective layer 102 can be patterned using photolithographic processes which are also well known in the art.

When a substrate 101 using active matrix transistor driving circuitry is employed and reflective layer 102 is not conductive, then reflective layer 102 must be patterned so as to allow for electrical contact from the first electrode 112 to the underlying active matrix circuitry. If the reflective layer 102 is conductive, then it must be patterned so as to not form an electrical connection between neighboring pixels.

First transparent electrode 112 is connected to one pole of a voltage/current source (not shown), which can be applied directly or through the use of thin film transistor circuitry located on substrate 101. First transparent electrode 112 is configured in this embodiment as an anode. It will be understood that other embodiments are possible where, depending on the arrangement of the layers in pixel 10, first transparent electrode 112 can be configured as a cathode.

The first transparent electrode 112 must be both conductive and transparent. Common transparent materials used in this invention are indium-tin oxide (ITO), indium-zinc oxide (IZO) and tin oxide, but other conductive metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as an anode material. In addition, various combinations of these materials can be effective. While first transparent electrode 112 is shown as only one layer, it is understood that multiple sublayers of different electrode materials can be added to achieve a desired conductivity, work function, and transparency. In such a case, metals such as Al, Ag, MgAg can be used as one of the layers if deposited as a thin layer that is less than 25 nm and preferably less than 20 nm. The preferred anode materials have a work function of 4.1 eV or greater. Desired anode materials can be deposited by any suitable means such as evaporation, sputtering, chemical vapor deposition, or electrochemical means.

When used in conjunction with a substrate employing active matrix circuitry, the first transparent electrode 112 is made to be in electrical contact with the circuitry. In the case of multiple pixels 10, the first transparent electrodes 112 of neighboring pixels are also electrically isolated. The first transparent electrode 112 can be patterned using well known photolithographic processes.

The organic EL media 120 is disposed over first transparent electrode 112. Typically organic EL media 120 comprises more than one layer. In the embodiment depicted in pixel 10, organic EL media 120 includes hole-injecting layer (HIL) 121, hole-transporting layer (HTL) 122, light-emitting layer (LEL) 123, and electron-transporting layer (ETL) 124. The layers of the organic EL media listed here are only one example of the possible organic EL media layers which are known in the art. There are numerous configurations of the organic layers wherein the present invention can be successfully practiced.

While not always necessary, it is often useful that a hole-injecting layer 121 be provided in an organic light-emitting display. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1,029,909 A1.

Hole-transporting materials useful in hole-transporting layer 122 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula (A).

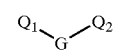

A wherein:
  $Q_1$ and $Q_2$ are independently selected aromatic tertiary amine moieties; and
  G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula (A) and containing two triarylamine moieties is represented by structural Formula (B).

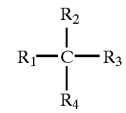

B where $R_1$ and $R_2$ each independently represent a hydrogen atom, an aryl group, or an alkyl group or $R_1$ and $R_2$ together represent the atoms completing a cycloalkyl group; and
  $R_3$ and $R_4$ each independently represent an aryl group, which is in turn substituted with a diaryl substituted amino group, as indicated by structural Formula (C).

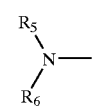

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines Desirable tetraaryldiamines include two diarylamino groups, such as indicated by Formula (C), linked through an arylene group. Useful tetraaryldiamines include those represented by Formula (D).

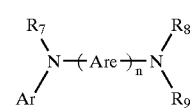

D wherein:
  each Are is an independently selected arylene group, such as a phenylene or anthracene moiety;
  n is an integer of from 1 to 4; and
  Ar, $R_7$, $R_8$, and $R_9$ are independently selected aryl groups.

In a typical embodiment, at least one of Ar, $R_7$, $R_8$, and $R_9$ is a polycyclic fused ring structure, e.g, a naphthalene.

The various alkyl, alkylene, aryl, and arylene moieties of the foregoing structural Formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula (B), in combination with a tetraaryldiamine, such as indicated by Formula (D). When a triarylamine is employed in combination with a tetraaryldiamine, the latter is positioned as a layer interposed between the triarylarnine and the electron injecting and transporting layer. Illustrative of useful aromatic tertiary amines are the following:

1,1-Bis(4-di-p-tolylaminophenyl)cyclobexane 1,1-Bis(4-di-p-tolylaminophenyl)4-phenylcyclohexane 4,4'-Bis(diphenylamino)quadriphenyl Bis(4-dimethylarnino-2-methylphenyl)-phenylmethane N,N,N-Tri(p-tolyl)amine 4-(di-p-tolylarnino)-4'-[4(di-p-tolylamino)-styryl]stilbene N,N,N',N'-Tetra-p-tolyl-4-4'-diaminobiphenyl N,N,N',N'-Tetraphenyl-4,4'-diaminobiphenyl N-Phenylcarbazole Poly(N-vinylcarbazole)

N,N'-di-1-naphthalenyl-N,N'-diphenyl-4,4'-diaminobiphenyl 4,4'-Bis[N-(1-naphthyl)-N-phenylamino]biphenyl 4,4"-Bis[N-(1-naphthyl)N-phenylamino]p-terphenyl 4,4'-Bis[N-(2-naphthyl)-N-phenylamino]biphenyl 4,4'-Bis[N-(3-acenaphthenyl)-N-phenylamino]biphenyl 1,5-Bis[N-(1-naphthyl)-N-phenylamino]naphthalene 4,4'-Bis[N-(9-anthryl)-N-phenylamino]biphenyl 4,4"-Bis[N-(1-anthryl)-N-phenylamino]-p-terphenyl 4,4'-Bis[N-(2-phenanthryl)-N-phenylamino]biphenyl 4,4'-Bis[N-(8-fluoranthenyl)-N-phenylamino]biphenyl 4,4'-Bis[N-(2-pyrenyl)-N-phenylamino]biphenyl 4,4'-Bis[N-(2-naphthacenyl)-N-phenylamino]biphenyl 4,4'-Bis[N-(2-perylenyl)-N-phenylarnino]biphenyl 4,4'-Bis[N-(1-coronenyl)-N-phenylamino]biphenyl 2,6-Bis(di-p-tolylamino)naphthalene 2,6-Bis[di-(1-naphthyl)amino]naphthalene 2,6-Bis[N-(1-naphthyl)-N-(2-naphthyl)amino]naphthalene N,N,N',N'-Tetra(2-naphthyl)-4,4"-diamino-p-terphenyl 4,4'-Bis {N-phenyl-N-[4-(1-naphthyl)-phenyl]amino}biphenyl 4,4'-Bis[N-phenyl-N-(2-pyrenyl)amino]biphenyl 2,6-Bis[N,N-di(2-naphthyl)amine]fluorene 1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly (4styrenesulfonate) also called PEDOT/PSS.

A light-emitting layer 123 producing light in response to hole-electron recombination is deposited over hole-transporting layer 122. Useful organic emissive materials are well known. As more fully described in U.S. Pat. Nos. 4,769,292 and 5,935,721, the light-emitting layer 123 of the organic EL element comprises a luminescent or fluorescent material where electroluminescence is produced as a result of electron-hole pair recombination in this region. The light-emitting layer 123 can be comprised of a single material, but more commonly includes a host material doped with a guest compound or dopant where light emission comes primarily from the dopant and can be of any color. The host materials in the light-emitting layer can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host material to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

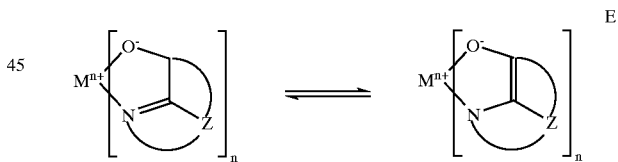

wherein:

M represents a metal;

n is an integer of from 1 to 3; and

Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]
CO-2: Magnesium bisoxine [alias, bis(8-quinolinolato) magnesium(II)]
CO-3: Bis[benzo {f}-8-quinolinolato]zinc (II)
CO-4: Bis(2-methyl-8-quinolinolato)aluminum(III)-$\mu$-oxo-bis(2-methyl-8-quinolinolato) aluminum(III)
CO-5: Indium trisoxine [alias, tris(8-quinolinolato) indium]
CO-6: Aluminum tris(5-methyloxine) [alias, tris(5-methyl-8-quinolinolato) aluminum(III)]
CO-7: Lithium oxine [alias, (8-quinolinolato)lithium(I)]

Derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red.

F

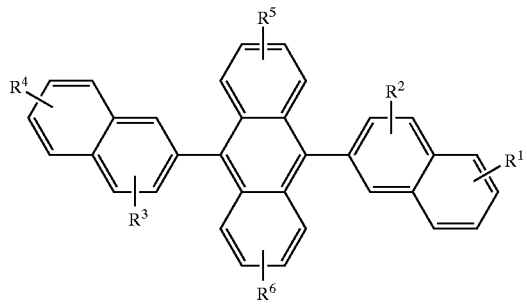

wherein:

$R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

Benzazole derivatives (Formula G) constitute another class of useful host materials capable of supporting electroluminescence, and are particularly suitable for light emission of wavelengths longer than 400 nm, e.g., blue, green, yellow, orange or red.

G

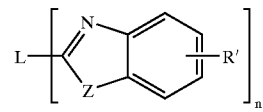

where:

n is an integer of 3 to 8;
Z is O, NR or S; and
R' is hydrogen; alkyl of from 1 to 24 carbon atoms, for example, propyl, t-butyl, heptyl, and the like; aryl or heteroatom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which conjugately or unconjugately connects the multiple benzazoles together.

An example of a useful benzazole is 2, 2', 2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

L1

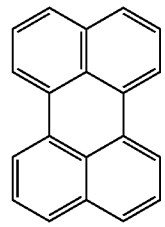

L2

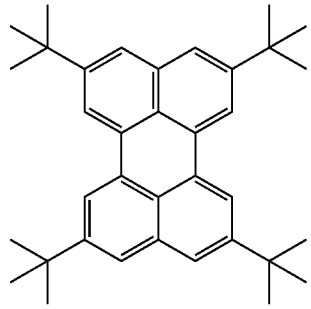

L3

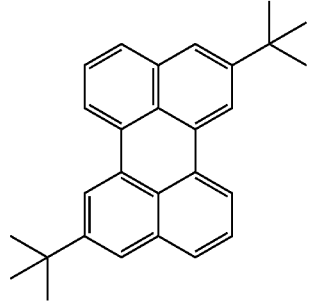

L4

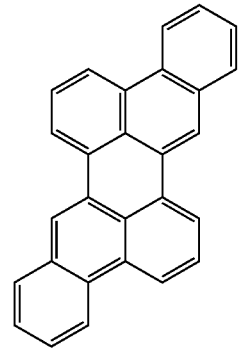

-continued

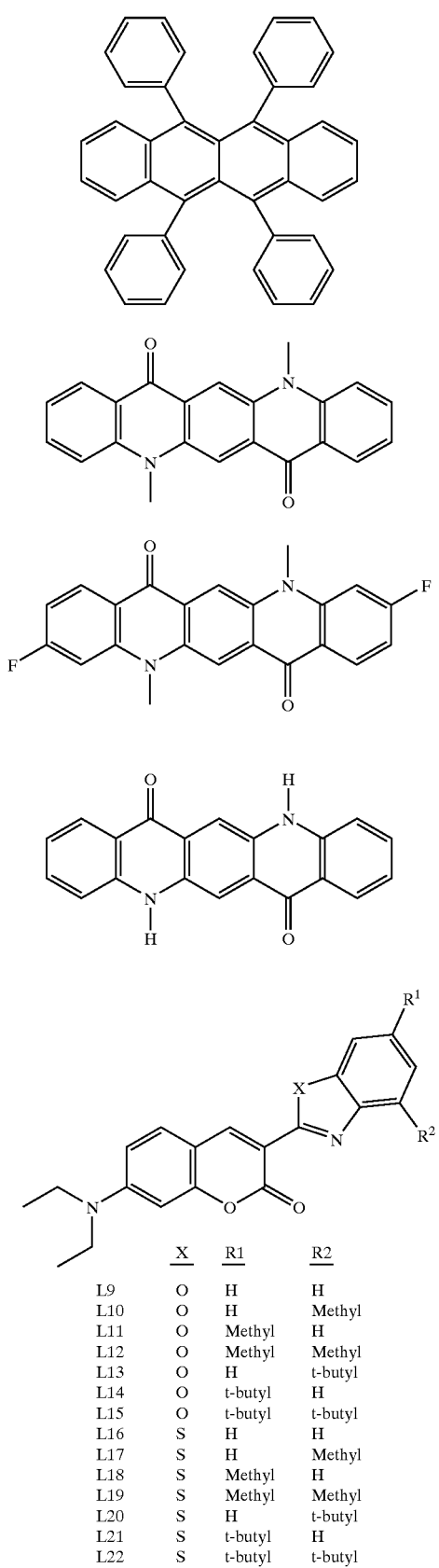

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

-continued

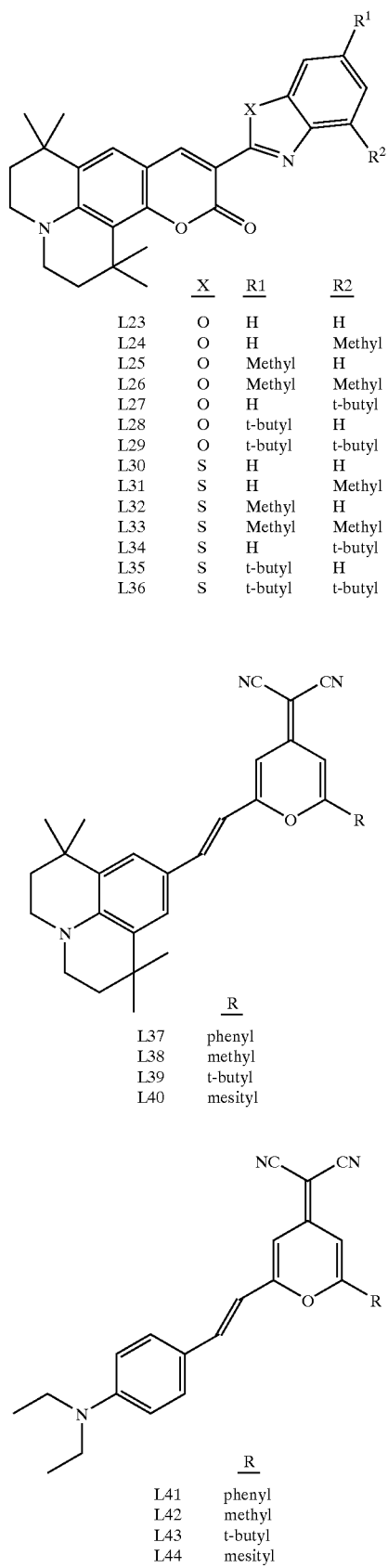

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

| | R |
|---|---|
| L37 | phenyl |
| L38 | methyl |
| L39 | t-butyl |
| L40 | mesityl |

| | R |
|---|---|
| L41 | phenyl |
| L42 | methyl |
| L43 | t-butyl |
| L44 | mesityl |

-continued

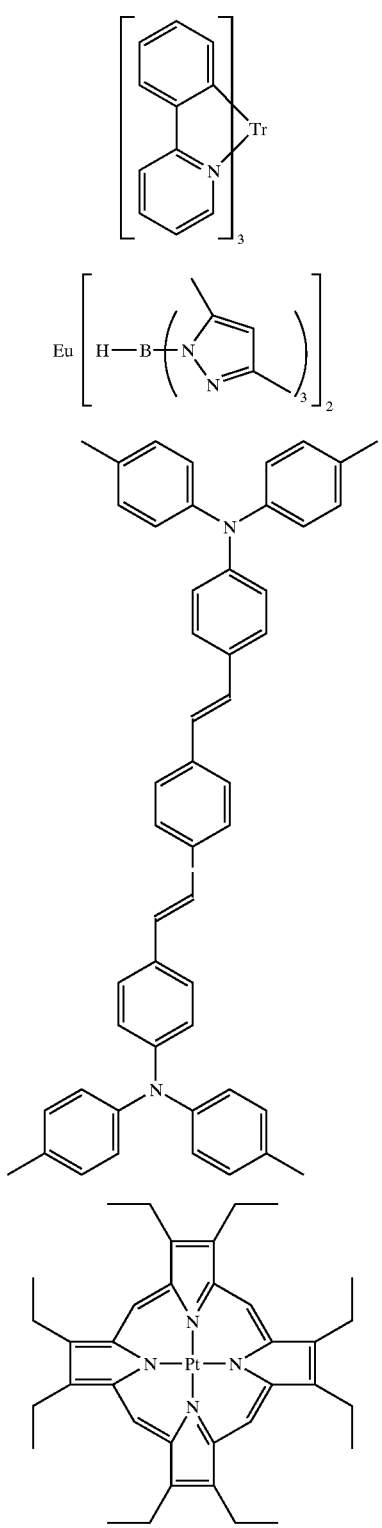

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references therein.

Although not shown, light-emitting layer 123 can additionally comprise two or more emissive layers, if such is desired for proper emissive properties of the resulting OLED device.

Electron-transporting layer 124 is deposited over light-emitting layer 123. Desired electron-transporting materials can be deposited by any suitable means such as evaporation, sputtering, chemical vapor deposition, or electrochemical means. Preferred electron transporting materials for use in electron-transporting layer 124 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula (G) are also useful electron transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

There are numerous configurations of the organic EL media 120 layers wherein the present invention can be successfully practiced. Examples of organic EL media layers that emit white light are described, for example, in EP 1 187 235; Publication U.S. patent application Ser. No. 2002/0025419 A1; EP 1 182 244; U.S. Pat. Nos. 5,683,823, 5,503,910, 5,405,709, and 5,283,182. As shown in EP 1 187 235 A2, a white-emitting organic EL media can be achieved by the inclusion of the following layers:

a hole-injecting layer 121 disposed over the anode;

a hole-transporting layer 122 that is disposed over the hole-injecting layer 121 and is doped with a rubrene compound for emitting light in the yellow region of the spectrum a light-emitting layer 123 doped with a blue light-emitting compound disposed over the hole-transporting layer 122; and an electron transporting layer 124.

The organic EL media materials mentioned above are suitably deposited through a vapor-phase method such as sublimation, but can be deposited from a fluid, for example, from a solvent with an optional binder to improve film formation. If the material is a polymer, solvent deposition is useful, but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be premixed and coated from a single boat or donor sheet.

In the region between and around the pixels, no precision patterning of the organic EL media is required for the present invention and these layers can be common across all the pixels.

The second transparent electrode 130 is disposed above the organic EL media 120. Desirable properties of the second transparent electrode 130 include being highly transparent, having good film-forming properties to ensure good contact with the underlying organic layer, being highly conductive, and having good stability. When the organic EL device is configured such that the second transparent electrode 130 serves as the cathode, as shown here, the second transparent electrode 130 should also promote electron injection at low voltage.

Second transparent electrode 130 comprises at least transparent conducting layer 132. Typical materials used for the transparent conducting layer 132 are metals which must be thin, or transparent conductive oxides, or a combination of these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236; 6,284,393; JP 3,234,963; and EP 1 076 368.

Useful transparent conducting layer materials often contain a low work function metal (<4.0 eV) or metal alloy. Another suitable class of cathode materials includes bilayers comprising a thin electron-injecting layer (EIL) 131 in contact with the organic EL media layer 120 and which is capped with a thicker transparent conducting layer 132. Here, the electron-injection layer 131 preferably includes a low work function metal or metal salt, and if so, the thicker capping layer does not need to have a low work function. Second transparent electrode materials are typically deposited by evaporation, sputtering, or chemical vapor deposition.

While the transparent conducting layer 132 is shown here as only a single layer, it is understood that multiple adjacent layers of thin metals, metal oxides, and other materials can be used to achieve the desired properties of the second transparent electrode 130.

The second transparent electrode 130 in typical active matrix organic EL circuits is common and electrically connected for all pixels. Therefore, no precision patterning of the second transparent electrode 130 layers between and around the pixels is required.

Most organic EL devices are sensitive to moisture or oxygen, or both, so they are commonly sealed with an encapsulating layer or structure. For top emission organic EL devices, this can be in the form of a transparent cover plate, typically made of glass or plastic and sealed at the edges, or thin film layer such as $SiO_2$ that serves as a moisture barrier. A thin film encapsulation layer 141 is shown here.

The color filter 151 includes color filter elements for the color to be emitted from pixel 10. Several types of color filters are known in the art. One type of color filter 151 is formed on a second transparent substrate and then aligned with the pixels of the first substrate 101. A second type of color filter 151 is formed directly over the elements of pixel 10. In a display comprising multiple pixels, the space between the individual color filter elements can also be filled with a black matrix (not shown) to reduce pixel cross talk and improve the display's contrast. While color filter 151 is shown here as being located above the encapsulation layer 141, it may alternatively be located between the encapsulation layer 141 and the second transparent electrode 130.

When first and second transparent electrodes 112 and 130 are connected to a voltage/current source such that the electrode configured as the anode is at a more positive potential than the electrode configured as the cathode, holes are injected from the anode and transported through the hole-transporting layer 122, and electrons are injected from the cathode and transported through the electron-transporting layer 124. Electron-hole pairs then recombine in or near the light-emitting layer 123 producing light. The color of the light is determined by the energy band structure of the host and dopant materials used in the construction of the organic EL media. As described above, the use of multiple emitting layers can produce effective white light.

The light generated by the electron-hole pair recombination is initially directed in all directions. A substantial component, which is less than 50% of the total emitted light, is initially directed in the intended direction toward the viewer. According to the present invention, that is away from the substrate and is hereby referred to as the non-reflected component 201 of colored light. An equal component is directed in the opposite direction, and is hereby referred to as the secondary light component 202. Secondary light component 202 is reflected by the reflective layer 102 as the reflected component 203 of colored light Reflected light component 203 and non-reflected component 201 then interfere with each other and, after filtering by color filter 151, are seen by the viewer as light 210.

In order to achieve the object of the invention, a substantial amount of reflected component 203 of colored light corresponding to the associated color filter 151 should be controlled so as to constructively interfere with a substantial amount of non-reflected component 201 of colored light corresponding to color filter 151 and thereby enhance the light 210 received by the viewer and improve the device efficiency. In order to control the type of optical interference, the thickness of the layers between the point of emission 205 and the point of reflection 207 needs to be equal to an integral multiple of one-half the wavelength, with adjustment for any phase shift that occurs due to the reflection. This relationship is given by Equation 1.

$$d = \left(N + \frac{\theta_{Shift}}{2\pi}\right) \times \frac{\lambda}{2n} \qquad \text{Equation 1}$$

where:
  d is the layer thickness;
  N is an integer number;
  n is the refractive index of the layer;
  θ is the phase shift which occurs at point of reflection 207; and
  λ is the principle wavelength of concern.

The point of emission 205 can be taken to be the interface of the hole-transporting layer 122 and the light-emitting layer 123. Therefore, multiple layers including at least the hole-transporting layer 122 and the first transparent electrode 112 can exist between point of emission 205 and point of reflection 207. Given the existence of these multiple layers, Equation 2 can be used.

$$\frac{2}{\lambda}\left(\sum d_1 n_1 + d_2 n_2 + \ldots\right) - \frac{\theta_{Shift}}{2\pi} = N \qquad \text{Equation 2}$$

where $d_1 n_1$ is the thickness and refractive index of the first layer, $d_2 n_2$ is the thickness and refractive index of the second layer, etc. In the embodiment of pixel 10, the layers used in Equation 2 are first transparent electrode 112, hole-injecting layer 121, and hole-transporting layer 122. For a multicolor device, the principle wavelength of concern varies by color of the pixel and will be the wavelength transmitted by the color filter 151. The final combination of the thickness used should result in an integer number N in Equation 2. It is, of course, difficult to deposit the various layers such that N will be exactly an integer. It is sufficient for this invention that N be an integer±0.25, and preferably an integer±0.1.

The thickness of the first transparent electrode 112 must be varied depending on the color of the light 210 emitted by pixel 10. The necessary thickness of the first transparent electrode 112 for the pixel can be first determined using Equation 2. Each pixel 10 of a different color will have an optimum calculated thickness for the first transparent electrode 112 such that N in Equation 2 is within the necessary limits. The thickness of first transparent electrode 112 is therefore separately adjusted for each different color.

Figure 2:
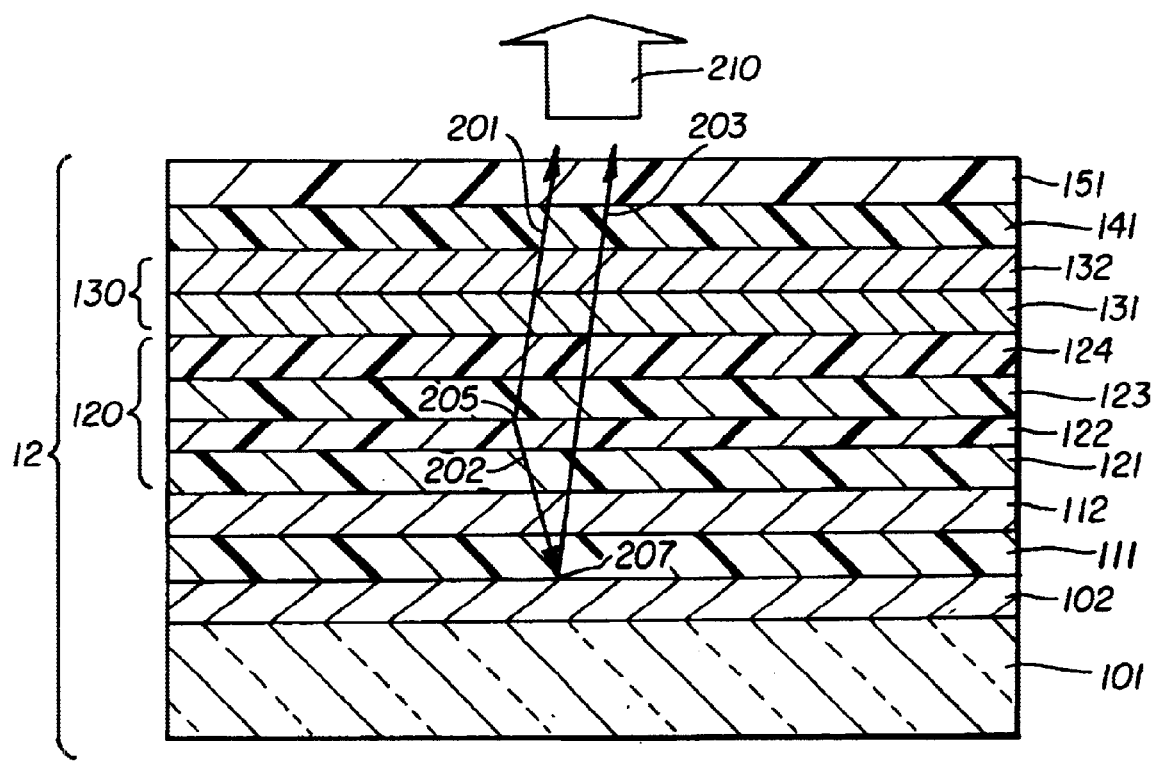
FIG. 2 shows a typical cross section of a pixel which would be used to form a multicolor device according to a second embodiment of the present invention.

Turning now to FIG. 2, there is shown a typical cross-section of a pixel 12 which would be used to form a multicolor device according to a second embodiment of the present invention. Pixel 12 comprises the layers already described for pixel 10, with the addition of transparent optical layer 111 disposed between reflective layer 102 and first transparent electrode 112.

The transparent optical layer 111 can be formed from many different materials that are optically transparent. Such materials include but are not limited to $SiO_2$, $Si_3N_4$, $Si_xO_yN_z$, and diamond-like-carbon (DLC). Methods of depositing these materials are known in the art and include chemical vapor deposition (CVD) and plasma-enhanced CVD (PE-CVD). These materials can also be patterned using standard photolithography techniques. The transparent optical layer 111 does not have to be conductive. When possible, it is preferable that materials for the first transparent electrode 112 and the transparent optical layer 111 be selected to match approximately the refractive indices of the two layers, so at to minimize reflection at the interface of these two layers. The thickness of the transparent optical layer 111 is adjusted according to Equation 2 for pixels of different colors using transparent optical layer 111, first transparent electrode 112, hole-injecting layer 121, and hole-transporting layer 122 in the calculation of Equation 2. This embodiment has a further advantage over the first embodiment above in that the first transparent electrode 112 is not required to be a specific thickness. This allows for first transparent electrode 112 to be constructed of materials which are transparent only when deposited in a thin layer, e.g. metals (Al, Mg, Ag, MgAg, Mo). The first transparent electrode 112 in this embodiment preferably is deposited at the same thickness for all pixels so as to minimize process steps. If first transparent electrode 112 comprises a thin layer of metal, it preferably has a thickness of 25 nm or less.

Figure 3:
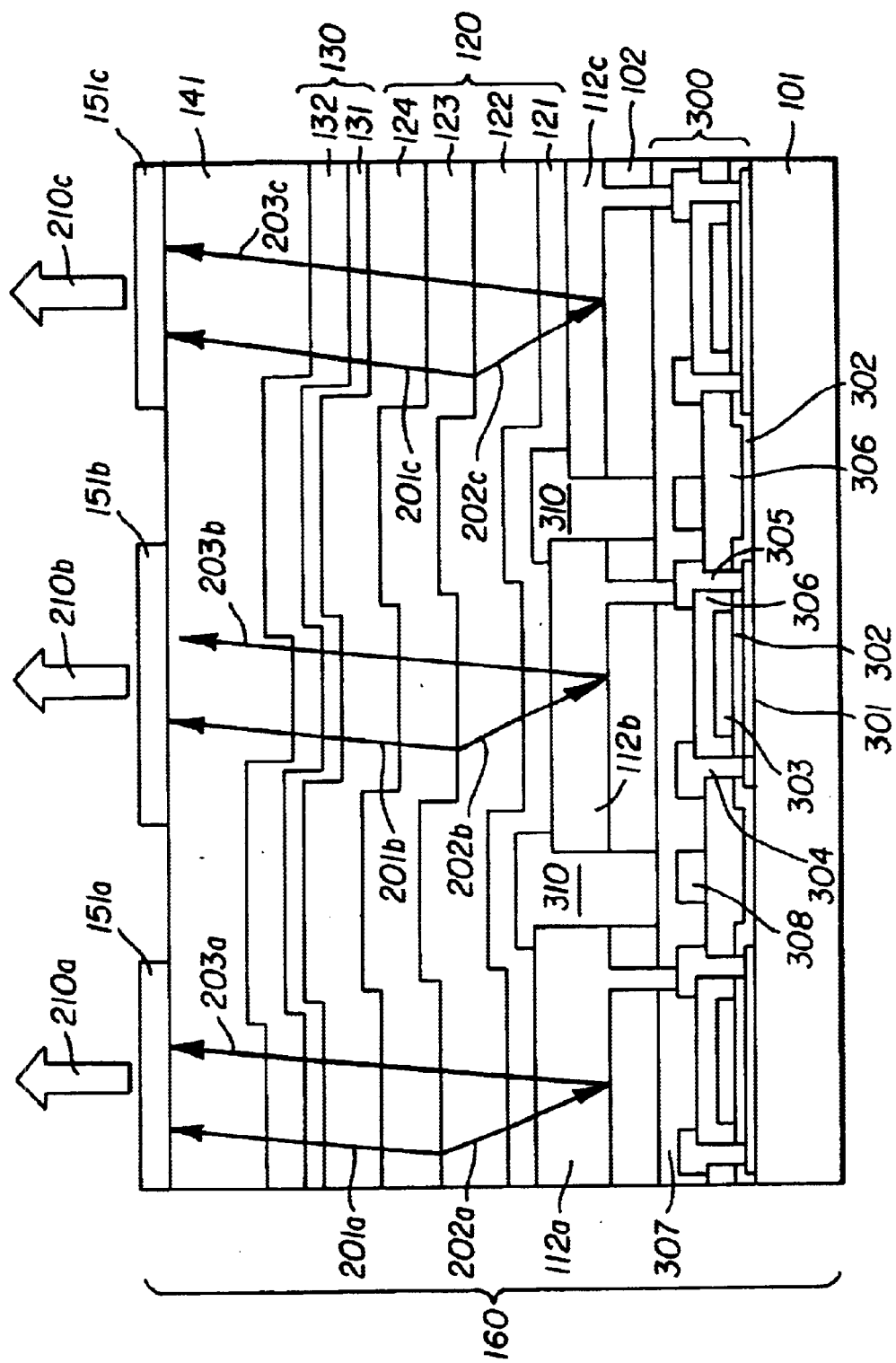
FIG. 3 shows a cross sectional view of three pixels of a multicolor device having active matrix driving circuitry according to the above first embodiment of the present invention.

The above first embodiment of the present invention can be employed in multicolor organic EL devices that are top-emitting and where white light is generated in the organic EL medium and where the light passes through a multicolor filter array to produce a multicolor display. Turning now to FIG. 3, there is shown a cross-sectional view of three pixels of a multicolor device 160 having active matrix driving circuitry according to the above first embodiment. Multicolor device 160 represents any multicolor organic light-emitting display having an array of pixels having at least two different colors. Active matrix circuitry 300 can be fabricated on the substrate 101. These active circuitry layers may form various circuitry components such as TFT's, capacitors, and other circuit components and connections. The preferred structures include such circuitry. An example of an organic EL with circuitry on the substrate is described in U.S. Pat. No. 5,550,066.

Active matrix circuitry 300 includes one signal line 308 and TFT comprised of a silicon active layer 301, a gate dielectric 302, a gate conductor 303, a source contact 304, a drain contact 305, a first insulating layer 306, and a second insulating layer 307 per pixel. Methods of fabricating the TFT circuitry are well known in the art. While only a single transistor and signal line are shown for each pixel, typically, each pixel also has a second transistor (not shown) as well as a capacitor and additional signal lines. Many types of circuits having different numbers and configurations of circuit components are known in the art, and it is understood that a wide variety of these circuits will work with this invention. While the transistors shown are fabricated on a thin silicon active layer 301, it is understood that with semiconducting substrates, the substrate may actually serve this function. A top gate structure is shown with the gate above the silicon active layer, however, it is also known in the art that TFT's with an inverse structure known as bottom gate can be used to drive organic EL devices.

Besides the substrate 101 and active matrix circuitry 300, each pixel is comprised of a reflecting layer 102, a first electrode fabricated to different thicknesses 112a, 112b, or 112c, a multilayer organic EL media 120 as described above, and a second transparent electrode 130 as described above. As described above, the EL media in each of the three pixels produces light having non-reflected light components 201a, 201b, 201c and secondary light components 202a, 202b, 202c. The secondary light components are then reflected becoming reflected light components 203a, 203b, 203c. The first transparent electrodes 112 of the pixels must be electrically isolated from neighboring pixels. If a conductive material is chosen as the reflecting layer 102, it is preferable that this layer too be electrically isolated between neighboring pixels. An interpixel dielectric 310 layer, as described in U.S. Pat. No. 6,246,179, is preferably used to cover the edges of the first transparent electrode 112 to prevent shorts or strong electric fields in this area. As shown in FIG. 3, the interpixel dielectric 310 also preferably covers the edges of the reflecting layer 102 when this layer is patterned so as to electrically isolate reflecting layer 102 between neighboring pixels. Preferred materials for the interpixel dielectric 310 include $SiO_2$, silicon nitride, spin-on glass (SOG), and photosensitive resins, all of which are deposited and patterned using methods well known in the art. The entire display is protected by an encapsulation layer 141. In this embodiment, a first, second, and third color filters 151a, 151b, and 151c having different colors are disposed over different predetermined pixels or subpixels of the array. These color filters allow light 210a, 210b, 210c of a narrowed band of wavelengths to pass and be seen by the viewer. In a full color display, these are typically red, green, and blue.

It is an object of the present invention that the layers of the organic EL media 120 not require any patterning between and around the pixels, and therefore these layers cannot be varied in thickness for different color pixels. Therefore, according to the first above embodiment of the invention, only the thickness of the first transparent electrode is varied for pixels of different colors, so to ensure that reflected components 203a, 203b, and 203c constructively interfere with the respective non-reflected components 201a, 201b, and 201c for the respective colors. The thickness of the first transparent electrodes 112a, 112b, and 112c must be varied for the pixels of different colors. The thickness of the first transparent electrode for all the pixels is first determined using Equation 2. The maximum thickness value can then be selected and the first transparent electrode 112 can be deposited to that thickness. The thickness of the first transparent electrode 112 can then be reduced in the region of other pixel colors by well kmown photolithography and etching processes. This can be repeated for each color in the display beyond the first. It will be understood that other processes where the first transparent electrode is initially deposited to the thinnest value and material is selectively added to increase thickness are also possible. Still other processes involving combinations of material removal and addition are envisioned as possible and considered within the spirit and scope of the invention. Furthermore, when multiple sublayers of first transparent electrode 112 are present, the thickness of only one or of several of the sublayers may be adjusted to achieve the objective of the invention.

Figure 4:
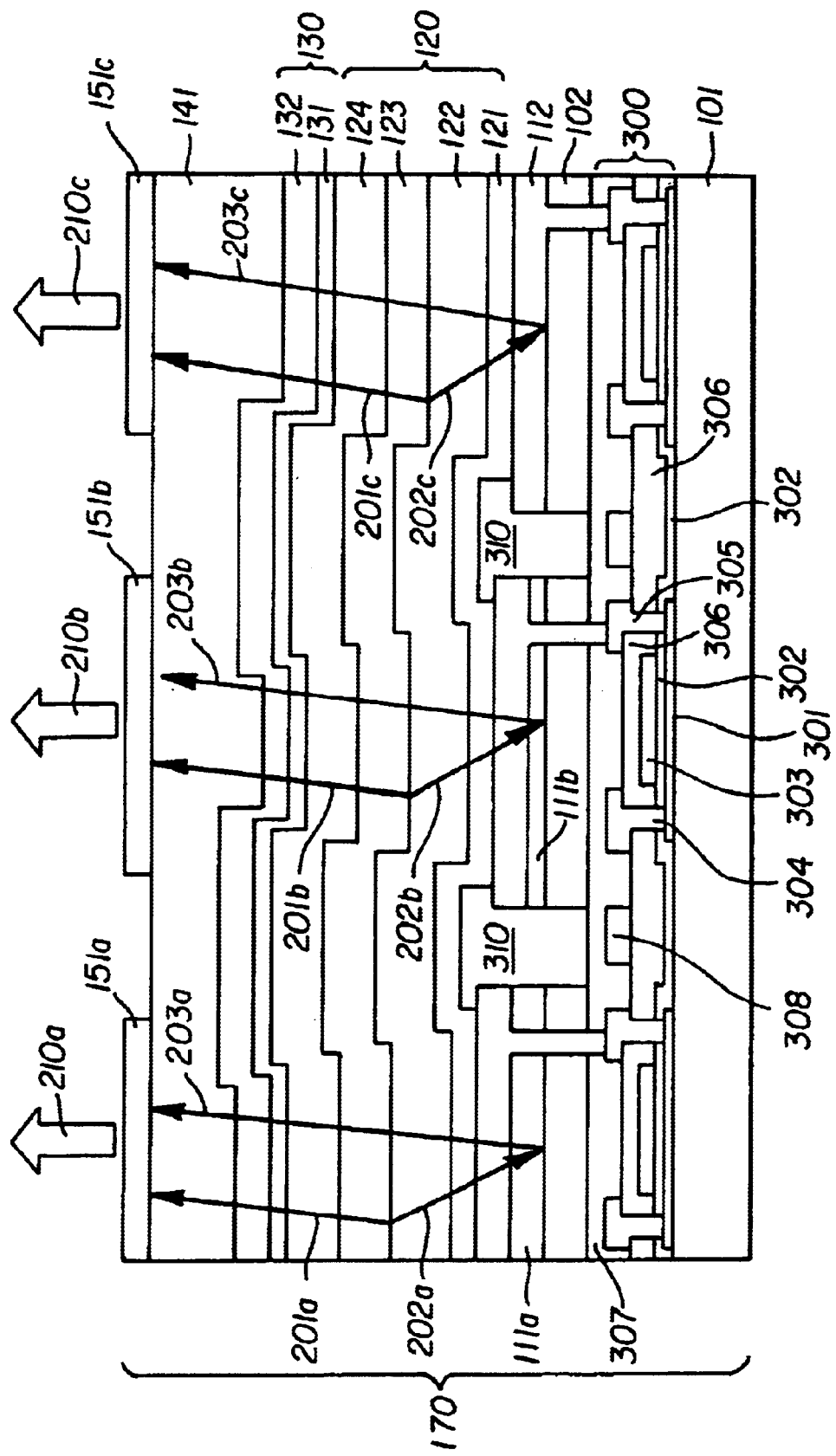
FIG. 4 shows a cross sectional view of three pixels of a multicolor device having active matrix driving circuitry according to the above second embodiment of the present invention.

Turning now to FIG. 4, there is shown a cross-sectional view of three pixels of a multicolor device 170 having active matrix driving circuitry according to the above second embodiment. This embodiment is comprised of pixels with all the layers present in multicolor device 160 with one or more of the pixels having the addition of a transparent optical layer 111a, 111b disposed between the first transparent electrode 112 and the reflecting layer 102. The first transparent electrode 112 has a common thickness in all pixels of multicolor device 170. Varying the thickness of transparent optical layers 111 ensures that reflected components 203a, 203b, and 203c constructively interfere with the respective non-reflected components 201a, 201b, and 201c for the respective colors.

It is further possible, and preferable, that the thickness of the other layers which are common to all pixels are optimized for one group of pixels having the same color without the transparent optical layer 111, and then the transparent optical layer 111 is only present in the other groups of pixels having additional colors, as in multicolor device 170. For example, when considering a three-color display, that is a display having three pixel color groups, only two groups of pixels having the same color may need the transparent optical layer 111. This case minimizes the number of areas having a different thickness of the transparent optical layer and therefore minimizes total manufacturing process steps. Transparent optical layer 111 can be deposited to a common thickness and then selectively reduced or deposited in desired areas, as described for first transparent electrode 112 in multicolor device 160, above.

The entire contents of the patents and other publications referred to in this specification are incorporated herein by reference. The invention has been described in detail with particular reference to certain preferred embodiments thereof, but will understood that variations and modifications can be effected within the spirit and scope of the invention.

PARTS LIST 10 pixel
12 pixel
101 substrate
102 reflective layer
111 transparent optical layer
111a transparent optical layer
111b transparent optical layer
112 first transparent electrode
112a first transparent electrode
112b first transparent electrode
112c first transparent electrode
120 organic EL media
121 hole-injecting layer (HIL)
122 hole-transporting layer (HTL)
123 light-emitting layer (LEL)
124 electron-transporting layer (ETL)
130 second transparent electrode
131 electron-injecting layer (EIL)
132 transparent conducting layer
141 encapsulation layer
151 color filter
151a third color filters
151b third color filters
151c third color filters
160 multicolor device
170 multicolor device
201 non-reflected component
201a non-reflected light component
201b non-reflected light component
201c non-reflected light component
202 secondary light component
202a secondary light component
202b secondary light component
202c secondary light component
203 reflected light component
203a reflected light component
203b reflected light component
203c reflected light component
205 point of emission
207 point of reflection
210 light
210a light
210b light
210c light
300 active matrix circuitry
301 silicon active layer
302 gate dielectric
303 gate conductor
304 source contact
305 drain contact
306 first insulating layer
307 second insulating layer
308 signal line
310 interpixel dielectric

What is claimed is:

1. A multicolor organic light-emitting display having an array of pixels having at least two different colors comprising:

a) a substrate;

b) a reflective layer disposed over the substrate;

c) a first transparent electrode disposed over the reflective layer;

d) a second transparent electrode spaced from the first transparent electrode;

e) organic EL media disposed between the first and second transparent electrodes and arranged to produce white light;

f) at least first and second filters of different colors disposed respectively over different predetermined pixels of the array; and g) wherein the thickness of the first transparent electrode is separately adjusted for each different color to cause a substantial amount of the reflected component of colored light corresponding to its associated color filter to constructively interfere with a substantial amount of the non-reflected component of colored light corresponding to its associated color filter.

2. The multicolor organic light-emitting display of claim 1 including three different color filters which pass red, green, and blue light to produce a full color display.

3. The multicolor organic light-emitting display of claim 1 wherein the first transparent electrode comprises a conductive metal oxide.

4. The multicolor organic light-emitting display of claim 3 wherein the conductive metal oxide is indium-tin oxide, indium-zinc oxide, or tin oxide, or combinations thereof.

5. A multicolor organic light-emitting display having an array of pixels having at least two different colors comprising:
   a) a substrate;
   b) a reflective layer disposed over the substrate;
   c) a first transparent electrode disposed over the reflective layer;
   d) a second transparent electrode spaced from the first transparent electrode;
   e) organic EL media disposed between the first and second transparent electrode and arranged to produce white light;
   f) at least first and second filters of different colors disposed respectively over different predetermined pixels of the array;
   g) wherein at least one group of pixels having the same color also comprises a transparent optical layer disposed between the reflective layer and the first transparent electrode; and
   h) wherein the thickness of the transparent optical layer is separately adjusted for each different color to cause a substantial amount of the reflected component of colored light corresponding to its associated color filter to constructively interfere with a substantial amount of the non-reflected component of colored light corresponding to its associated color filter.

6. The multicolor organic light-emitting display of claim 5 including three different color filters which pass red, green, and blue light to produce a full color display.

7. The multicolor organic light-emitting display of claim 5 wherein the first transparent electrode comprises a conductive metal oxide.

8. The multicolor organic light-emitting display of claim 7 wherein the conductive metal oxide is indium-tin oxide, indium-zinc oxide, or tin oxide, or combinations thereof.

9. The multicolor organic light-emitting display of claim 5 wherein the first transparent electrode comprises a thin layer of metal.

10. The multicolor organic light-emitting display of claim 9 wherein the layer of metal has a thickness of less than 25 nm.

11. The multicolor organic light-emitting display of claim 10 wherein the metal comprises Al, Ag, Mg, Mo, or combinations thereof.

12. The multicolor organic light-emitting display of claim 5 wherein the transparent optical layer comprises $SiO_2$, $Si_3N_4$, $Si_xO_yN_z$, or diamond-like carbon.

* * * * *